(12) United States Patent
Lardin et al.

(10) Patent No.: US 10,859,614 B2
(45) Date of Patent: Dec. 8, 2020

(54) SIGNAL DETECTION APPARATUS, METHOD, AND APPLICATIONS

(71) Applicant: Mezmeriz Inc., Ithaca, NY (US)

(72) Inventors: Clifford A. Lardin, Havertown, PA (US); Shahyaan Desai, Ithaca, NY (US)

(73) Assignee: Mezmeriz Inc., Ithaca, NY (US)

( * ) Notice: Subject to any disclaimer, the term of this patent is extended or adjusted under 35 U.S.C. 154(b) by 0 days.

(21) Appl. No.: 16/070,843

(22) PCT Filed: Jan. 4, 2017

(86) PCT No.: PCT/US2017/012111
§ 371 (c)(1),
(2) Date: Jul. 18, 2018

(87) PCT Pub. No.: WO2017/127230
PCT Pub. Date: Jul. 27, 2017

(65) Prior Publication Data
US 2019/0025356 A1    Jan. 24, 2019

Related U.S. Application Data

(60) Provisional application No. 62/286,624, filed on Jan. 25, 2016, provisional application No. 62/286,025, filed on Jan. 22, 2016.

(51) Int. Cl.
*G01R 23/167*   (2006.01)
*G01S 7/4913*   (2020.01)
(Continued)

(52) U.S. Cl.
CPC ........... *G01R 23/167* (2013.01); *G01R 23/14* (2013.01); *G01S 7/4913* (2013.01); *G01S 17/34* (2020.01); *H03L 7/0991* (2013.01); *H03L 7/16* (2013.01)

(58) Field of Classification Search
CPC ........ G01S 17/34; G01P 3/366; G01R 23/167
(Continued)

(56) References Cited

U.S. PATENT DOCUMENTS

2003/0117319 A1   6/2003  Rideout et al.
2007/0091295 A1   4/2007  Xu et al.
(Continued)

FOREIGN PATENT DOCUMENTS

EP   1672382   6/2006
EP   2536041   12/2012
EP   2762921   8/2014

OTHER PUBLICATIONS

Oppenheim,Alan V. et al., Discrete-Time Signal Processing, 2nd ed.; copyright 1999, 1989 Alan V. Oppenheim, Ronald W. Schafer; published by Prentice Hall, Inc., Upper Saddle River, NJ.
(Continued)

*Primary Examiner* — Leila Malek
(74) *Attorney, Agent, or Firm* — Bond, Schoeneck & King, PLLC; Jeffrey Powers

(57) ABSTRACT

Apparatus and associated method for unambiguously evaluating high-bandwidth, rapidly changing analog range data in real time using low-cost components that allow detection of the signal of interest using a sampling rate that is lower than the Nyquist rate required to directly evaluate the full range data bandwidth.

6 Claims, 1 Drawing Sheet

(51) Int. Cl.
  *G01S 17/34* (2020.01)
  *G01R 23/14* (2006.01)
  *H03L 7/099* (2006.01)
  *H03L 7/16* (2006.01)
(58) Field of Classification Search
  USPC .......................................................... 375/350
  See application file for complete search history.

(56) References Cited

U.S. PATENT DOCUMENTS

| | | |
|---|---|---|
| 2007/0236679 A1 | 10/2007 | Luo et al. |
| 2009/0315999 A1* | 12/2009 | Kurita .................. G01R 23/173 348/180 |
| 2010/0265491 A1 | 10/2010 | McDonald et al. |
| 2014/0232581 A1 | 8/2014 | Nguyen et al. |
| 2014/0240605 A1* | 8/2014 | Basawapatna ....... G01R 23/165 348/725 |

OTHER PUBLICATIONS

International Search Report and Written Opinion for PCT/US2017/012111 dated Mar. 22, 2017; Forms PCT/ISA/210 and PCT/ISA/237; 12 pages.
Extended European Search Report for European Application 17741750.8 dated Aug. 27, 2019; 7 pages.

* cited by examiner

SIGNAL DETECTION APPARATUS, METHOD, AND APPLICATIONS

CROSS-REFERENCE TO RELATED APPLICATIONS

This application is the United States National Phase Entry of PCT Application No. PCT/US2017/012111 filed on Jan. 4, 2017, which claims the benefit of U.S. Provisional Patent Application Nos. 62/286,624, filed on Jan. 25, 2016, and 62/286,025, filed on Jan. 22, 2016, the entire disclosure of each of which is incorporated herein by reference.

GOVERNMENT FUNDING

N/A.

BACKGROUND

Aspects and embodiments of the invention most generally are in the field of signal detection and processing. More particularly, aspects and embodiments are directed to a method and an apparatus for signal detection and processing and, most particularly to a method and apparatus for signal detection and processing at sampling rate lower than the standard minimum sampling rate, or Nyquist rate, and applications thereof, particularly directed to high resolution laser range finding.

Modern applications of laser range finding often seek to maximize the distance over which they can resolve range together with the range resolution, which implies wide-band modulation; and to minimize the pulse duration in order to acquire more data in less time. The combination of these requirements results in increasing bandwidth requirements for processing the ranging data, which can exceed 10 GHz over ranges of 10's of meters, depending on the range resolution and pulse duration. Systems that can sample at rates greater than 1 GHz are very costly and systems that can sample at rates greater than a few GHz quickly become impracticable. The embodied invention significantly reduces the sampling requirements for finding a signal in a large bandwidth. Resulting systems can be made at a significantly lower cost for a given performance level or a significantly improved performance level for a given sampling system.

High-resolution laser range finding using frequency-modulated pulse compression techniques can be accomplished using inexpensive semiconductor laser diodes by exploiting the wavelength shift these devices undergo when injection current is modulated in a specific way. The resulting wavelength shift is a potentially wide-band FM chirp; i.e., a linear ramp in the optical emission frequency of the laser anywhere from hundreds of MHz to hundreds of GHz centered around the laser diode's fundamental wavelength, which is often measured in hundreds of THz. This change in frequency can be accomplished in pulses as narrow as a few nanoseconds since these laser diodes are designed to be pulsed in the 10's of GHz in digital telecommunication modes.

The range accuracy of a linear frequency modulated (LFM) pulse is proportional to the change in frequency, i.e., to measure the range of a point with greater accuracy requires a larger change in frequency. The range resolution $\Delta_r$ (ability to distinguish between two simultaneous targets, or distance resolution of a single target) for a simple linear FM pulse compression ranging system is given by:

$$\Delta_r = \frac{c}{2\Delta_f}$$

where c is the speed of light in air and $\Delta_f$ is the bandwidth of the LFM pulse. For example, to resolve a point to a resolution of within 1 meter, only 150 MHz of $\Delta_f$ is required. However, if a range resolution of 1 centimeter is desired, then 15 GHz of $\Delta_f$ is required. Modern ranging systems suitable for real-time capture require sub-centimeter range resolution, requiring even greater $\Delta_f$.

The relationship between the beat frequency, $F_b$, and range, D, is as follows:

$$F_b = \frac{\Delta_f}{\Delta_t} \cdot \frac{2D}{c}$$

where $\Delta_f$=the bandwidth of the LFM pulse, $\Delta_t$ is the duration of the pulse, D is the distance to the reflection source, and c is the speed of light in air.

While it is desirable and straightforward to obtain relatively large $\Delta_f$ over short $\Delta_t$ using the current injection modulation method described above, the resulting beat frequency bandwidth also increases as $\Delta_f/\Delta_t$ increases.

Ranging applications including real-time mapping, automotive sensing applications, 3D video capture, and others require a high pixel rate (e.g., 5 Hz refresh rate at 640×480 p), currently in excess of 1.5 million pixels per second. Since pixel rate is inversely proportional to pulse time ($\Delta_t$), these applications seek to maximize $\Delta_f/\Delta_t$ within the bounds of beat frequency bandwidth processing capabilities and $\Delta_t$ over D. Furthermore, as D increases, holding all else constant, beat frequency bandwidth also increases linearly.

For example, a 640×480 scanning pixel FMCW laser ranging system operating with a range resolution of 1 cm, capable of measuring targets up to 10 m away at a refresh rate of 5 Hz, would require a $\Delta_f/\Delta_t$=15 GHz*(640*480*5) =2.3×10$^{16}$ Hz/s. The resulting beat frequency bandwidth would span to a maximum of 1.54 GHz, necessitating the use of a sampling system capable of sampling at a rate exceeding 3 GHz according to the Nyquist sampling criterion, to accurately find a beat tone occurring within this bandwidth. Analog to digital converter chips with sampling rates exceeding 1 GHz cost several hundreds if not thousands of dollars making them impractical for low cost systems such as automotive LIDAR sensors and consumer grade depth cameras.

While it is possible using existing technology to sample at ever higher speeds and process the large quantities of data generated in a relatively timely manner, doing so is more expensive than sampling more slowly and processing less data in the same amount of time. It is generally less expensive to operate digital logic circuitry in an integrated circuit (IC) such as a Field Programmable Gate Array (FPGA) or Application Specific IC (ASIC) at a lower speed, but a slower circuit can mean less data is processed in a given time. The circuitry (analog to digital converters, or ADCs) used to sample the raw data as it enters the digital logic system is also more expensive the faster it operates; further, the faster an ADC samples analog signals, the more data it produces per time period, which drives many cost-sensitive aspects of the digital logic IC that it supplies with data.

These speed and cost tradeoffs have direct implications for a high-resolution laser range finding system using frequency-modulated pulse compression, as discussed here. Running the processing logic more slowly can mean slower response time of the system as a whole and/or more limited distances over which the system may operate. A simple approach to maintaining system performance that involves high-speed sampling and IC processing logic increases costs, however.

It would be advantageous in the design of such a system to optimize key performance metrics such as system throughput and range resolution while minimizing cost. A key property of digital logic systems may be exploited to this end, when combined with analog-to-digital sampling and RF down-conversion techniques, which also facilitate the use of slower-speed, less expensive ADCs without impacting system performance.

SUMMARY

An aspect of the invention is a method for unambiguously identifying an unknown time varying signal that occurs within a known signal bandwidth. According to a non-limiting embodiment, the method includes the steps of sampling the known signal bandwidth at a sampling rate lower than a rate equal to at least twice the known signal bandwidth, further comprising splitting the unknown signal having an unknown frequency $\omega_{RF}$ into two signals of equal power; mixing one of the two split signals with a first signal having a known frequency $\omega_{LO1}$; and mixing the other of the two split signals with a second signal having a known frequency $\omega_{LO2}$. In various non-limiting, exemplary embodiments, the method may include some or all of the following steps, features, components, limitations, and/or characteristics, alone or in non-limiting combinations and/or variations appreciated by those skilled in the art:

wherein the first known frequency $\omega_{LO1}$ is at least half the known signal bandwidth and the second known frequency $\omega_{LO2}$ is higher than $\omega_{LO1}$;

wherein a difference between $\omega_{LO2}$ and $\omega_{LO1}$ is the lowest expected frequency of the unknown signal within the known signal bandwidth;

further comprising determining the frequencies of the two mixed signals using at least one of an Analog to Digital Converter and a Phase Locked Loop;

further comprising generating the signals of known frequencies using at least one of a crystal oscillator, a MEMS oscillator, a digital phase locked loop, and a frequency synthesizer;

further comprising using a first low pass filter to block the transmission of frequencies that are the sum of $\omega_{RF}$ and $\omega_{LO1}$, and using a second low pass filter to block the transmission of frequencies that are the sum of $\omega_{RF}$ and $\omega_{LO2}$.

An aspect of the invention is an electrical signal detection apparatus for unambiguously identifying an unknown time varying signal that occurs within a known signal bandwidth. According to a non-limiting embodiment, the apparatus includes a splitter adapted to split a signal of unknown frequency $\omega_{RF}$ into two signals of equal power; a first circuit configured to generate an electrical signal of a known frequency $\omega_{LO1}$ that is at least half the known signal bandwidth; a second circuit configured to generate an electrical signal of known frequency $\omega_{LO2}$ that is higher than $\omega_{LO1}$; a first mixer adapted to mix one of the two split signals with unknown frequency $\omega_{RF}$ with $\omega_{LO1}$; a second mixer adapted to mix the other of the two split signals with unknown frequency $\omega_{RF}$ with $\omega_{LO2}$; a first low pass filter coupled to the output of the first mixer; and a second low pass filter coupled to the output of the second mixer. In various non-limiting, exemplary embodiments, the apparatus may include some or all of the following features, components, limitations, steps, and/or characteristics, alone or in non-limiting combinations and/or variations appreciated by those skilled in the art:

further comprising at least one of an Analog to Digital Converter and a Phase Locked Loop, configured to determine the frequencies of the low pass filtered signals that are output from the first and second mixers;

wherein the circuits generating the signals of known frequency include at least one of a crystal oscillator, a MEMS oscillator, a digital phase locked loop, and a frequency synthesizer;

wherein the low pass filter coupled to the output of the first mixer is configured to block the transmission of frequencies that are the sum of $\omega_{RF}$ and $\omega_{LO1}$, and the low pass filter coupled to the output of the second mixer is configured to block the transmission of frequencies that are the sum of $\omega_{RF}$ and $\omega_{LO2}$.

An aspect of the invention is a laser range-finding method. According to a non-limiting embodiment, the method includes the steps of illuminating a surface of a distant object with a known frequency modulated laser beam over a known bandwidth; mixing the light reflected from the surface of the distant object with some fraction of the original illumination light on a photodetector; generating a range-encoded beat tone having an unknown frequency within a known maximum range dependent frequency bandwidth from the mixed light; and unambiguously determining the frequency of the range encoded beat tone. In various non-limiting, exemplary embodiments, the method may include some or all of the following steps, features, components, limitations, and/or characteristics, alone or in non-limiting combinations and/or variations appreciated by those skilled in the art:

wherein the step of unambiguously determining the frequency of the range encoded beat tone further comprises splitting the beat signal having an unknown frequency $\omega_{RF}$ into two halves of equal power; mixing one of the two split signals with a first signal having a known frequency $\omega_{LO1}$; and mixing the other of the two split signals with a second signal having a known frequency $\omega_{LO2}$; wherein the first known frequency $\omega_{LO1}$ is at least one-half of the known signal bandwidth and the second known frequency $\omega_{LO2}$ is higher than $\omega_{LO1}$, further wherein the difference between $\omega_{LO2}$ and $\omega_{LO1}$ is a lowest expected frequency of the unknown signal within the known signal bandwidth.

DETAILED DESCRIPTION OF NON-LIMITING, EXEMPLARY EMBODIMENTS OF THE INVENTION

Definitions

Sampling

Figure 1:
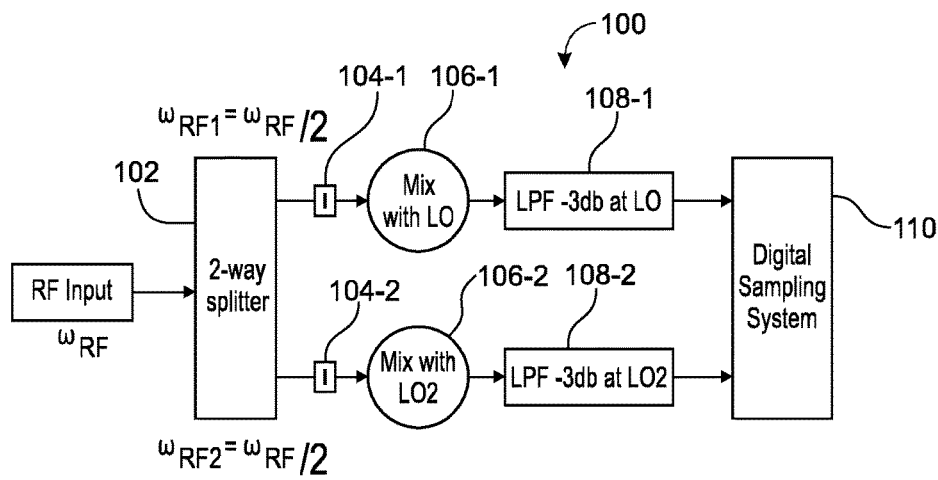
FIG. 1 is a schematic block diagram of an apparatus for unambiguously identifying an unknown time varying signal that occurs within a known signal bandwidth, according to an embodiment of the invention.

Sampling is the process of taking a time-varying continuous signal (e.g., analog signals such as electromagnetic waves; light, radio, etc.) and converting it into a discrete time signal (i.e., a digital signal) by measuring the continuous signal at discrete time intervals T.

Bandwidth

The continuous set of frequencies within which a signal of interest may lie.

Nyquist Sampling Rate

The minimum rate (1/T) at which a continuous signal needs to be sampled so that a discrete sequence of samples will capture all of the information within the continuous time signal of a finite bandwidth (all the different frequency components of the signal). The Nyquist theorem states that to capture all of the information within a time varying continuous signal of frequency, F, and to know everything about that signal one needs to take discrete samples of the signal at a rate at least 2F. Alternatively, if a signal may occur within a known bandwidth B, to find that signal one would have to sample at a rate of 2B; e.g., if the signal of interest may occur randomly within a set of frequencies ranging from 1-10 MHz, then to find that signal as it occurs one would need to sample the signal at >20 MHz.

Aliasing

The misidentification of the frequency of a signal is possible when a signal of frequency F is sampled at a rate less than 2F.

RF Mixing

When two or more time varying sinusoidal signals of frequency F1 and F2 are combined within an electronic mixer, the output of the mixer results in two separate signals; one at a frequency that is the sum F1+F2 of the two original signals, and another that is the difference F2−F1 of the two original signals.

Frequency Downconversion (Heterodyning)

Using the phenomenon of RF mixing to reduce the frequency of a signal; i.e., combining a signal with an initially high frequency, $F_{high}$, mixing it with a signal of known lower frequency $F_{mix}$. The mixed output results in $F_{high}+F_{mix}$, which can be filtered out and ignored, while $F_{high}-F_{mix}$ becomes the signal of interest, where the resultant frequency $F_{high}-F_{mix}$ is typically much lower than the frequency $F_{high}$ and can thus be sampled at a lower rate.

Photonic Mixing

The analog of RF mixing using light. Monochromatic light such as laser light produced by a single frequency laser diode has a single emission frequency ($v=c/\lambda$); i.e., all the photons emitted by the laser oscillate at the same frequency. For example, a laser with a wavelength of 1310 nm has an emission frequency of ~229 THz. If two single frequency lasers with different emission frequencies F1 and F2 are combined on the surface of a semiconductor photodetector, a time varying sinusoidal current is generated in the semiconductor. Two signals make up the time varying sinusoidal current signal, one with a frequency of F1+F2 and one with a frequency of F1−F2. For example, if the output of a laser with a wavelength of 1310 nm (F1~229 THz) is combined with the output of a laser with an emission wavelength of 1310.1 nm (F2=228.99 THz), the photodetector will output a signal with a frequency of 229-228.99=0.01 THz=10 GHz. Since most photodetectors are not fast enough to respond beyond 100 GHz, the second signal with a frequency of 229+228.99=457.99 THz is simply filtered out or ignored by the detector.

FMCW (or LFM) Laser Range Finding

The phenomenon of photonic mixing can be used to produce a very fast and accurate range/distance measuring device. Single frequency laser diodes can be made to sweep their emission frequency by modulating their injection current and or varying their temperature with time. Typically, a linear saw-tooth modulation of the laser emission frequency is desired. By illuminating a distant object with part of the frequency modulated laser light, and recombining the light reflected with part of the original emission onto a photodetector, an interferometer is formed where the path length between the point of emission and the object being illuminated forms one branch, the other branch consisting of a fixed length waveguide within the system. The frequency of the signal (also known as a beat tone) generated from the optical mixing process on the photodetector is proportional to the target distance, enabling precise and high speed range measurements. Using a scanning mirror to project and collect the reflected laser light off several points on an object results in the creation of a depth map of the surface of the object from the scanning system.

In digital logic design, it is possible to use a slower digital logic system to process the same amount or more data per time period as a high-speed system through the duplication of functional blocks that can run simultaneously within the IC. In this way, it is possible to use multiple lower-speed ADCs to sample the analog RF range information and process the slower data streams from these multiple ADCs simultaneously in digital logic, all at a slower clock rate. High-speed ADCs are expensive; ADCs that run at 50% of the speed of such a high-speed device can come at savings greater than 50%. Digital logic circuitry that can interface with multiple slower ADCs is less expensive than circuitry that can interface at higher speeds. This parallelization of using multiple slower ADCs to sample a signal, however, raises the number of components required in the electronic sampling subsystem.

According to an exemplary embodiment of the invention, a beat frequency detection method enables a sampling system to evaluate the entire beat frequency bandwidth using a sampling rate that is lower than the Nyquist sampling rate required to directly and unambiguously sample this full bandwidth. In other words, the embodied invention enables one to instantaneously determine an unknown frequency, ωRF, that may occur anywhere within a large bandwidth, and changing on a sec time scale, using two known frequencies of local oscillators, LO1, LO2.

It is well known that any discrete-time sampling system must operate at a sampling rate equal to at least twice the maximum frequency of the signal being sampled. In other words, a discrete-time sampling system will be incapable of unambiguously determining any input frequency that is greater than half the sampling rate of the system. For example, if a maximum sampling rate is 600 MHz, then the Nyquist frequency is 300 MHz; i.e., it is impossible to unambiguously determine the frequency of any signal higher than 300 MHz.

A system that undertakes to sample an unknown signal with frequency wRF that occurs within a bandwidth B=max (ωRF) using the minimum sampling rate necessary would, according to the Nyquist theorem, be required to employ a sampling rate $\omega_S \geq 2$ max($\omega_{RF}$). However, in laser ranging applications, it is frequently the case that the bandwidth B to be searched for $\omega_{RF}$ would require $\omega_S$ to be so large (>2 GS/s is common) as to be economically infeasible to implement. It would therefore appear desirable to limit $\omega_S$ in some way. It is common practice to accomplish this through a heterodyne downconversion operation using a local oscillator with frequency $\omega_{LO}$ such that $\omega_S = 2\omega_{LO}$.

It should be readily apparent that any signal with frequency $\omega_{RF} > \omega_{LO}$ given $\omega_{RF} < 2\omega_{LO}$ can be downconverted to a signal with frequency $\omega_{RF} - \omega_{LO}$ through the use of heterodyne processing. Even if the frequency ωRF is not known prior to the heterodyne operation, it can be determined after the downconversion because $\omega_{LO}$ is known. As known, the mixing process will also generate the sum frequency $\omega_{RF}+\omega_{LO}$, but since this result is always greater than $\omega_{RF}$, and thus of little value in a downconversion operation, it is usually eliminated with a low pass filter (LPF) prior to sampling. Further, given the requirements of the Nyquist theorem regarding bandlimiting the input signal, an LPF is a common component following a downconversion prior to a sampling stage. A sensible cutoff for an LPF for such a system would be $\omega_{LO}$ since $\omega_{LO}$ is chosen to maximize the bandwidth where the Nyquist rate is $2\omega_{LO}$. However, if $\omega_{RF}<\omega_{LO}$, the downconverted result will be DC at maximum and leave only $\omega_{LO}-\omega_{RF}$ visible to the sampling system. Further, if the LPF of the downconversion block is set to pass frequencies at or below $\omega_{LO}$, it will be unclear whether the heterodyne result is the sum or difference since only one result will ever be visible to the sampling system (keeping in mind that ωRF is the unknown). Thus, it would appear that a system that attempts to sample an unknown signal ωRF by mixing it with a single local oscillator with frequency $\omega_{LO}=\omega_{S}/2$ will be unable to make an absolute determination of $\omega_{RF}$. For example, if $\omega_{LO}=100$ MHz and ωRF=50 MHz, then the resulting mixed products will be 150 MHz and 50 MHz. With an LPF at 100 MHz, only the 50 MHz signal will be visible to the sampling system. However there are two possible frequencies for $\omega_{RF}$ that can produce a 50 MHz mixed product given a LPF=$\omega_{LO}$=100 MHz. If $\omega_{RF}$=50 MHz, $\omega_{RF}+\omega_{LO}$=150 MHz, which is filtered out, and $\omega_{LO}-\omega_{RF}$=50 MHz, which is visible to the sampling system; but, if $\omega_{RF}$=150 MHz, then $\omega_{RF}+\omega_{LO}$=250 MHz, which is filtered out by the LPF=$\omega_{LO}$=100 MHz, and $\omega_{RF}-\omega_{LO}$ is also 50 MHz. Thus it is impossible for the sampling system to know whether the mixed product of $\omega_{RF}$ and $\omega_{LO}$ is only one frequency.

The embodied invention makes it possible to resolve this ambiguity problem while still limiting $\omega_S<2\max(\omega_{RF})$ by incorporating a second fixed local oscillator with frequency $\omega_{LO2}=\omega_{RLO}+\omega_\delta$, where $\omega_\delta$ is dictated by the SNR of the sampling system and the overall sampling rate, which is now $\omega_S=2\omega_{LO2}$ ($\omega_\delta$=the lowest frequency desired to be sampled).

Example

Let $\max(\omega_{RF})$ be 1.0 GHz. Choose $\omega_{LO}=\frac{1}{2}\max(\omega_{RF})$ =500 MHz. Let $\omega_\delta$ be 100 MHz (i.e., the lowest sampling frequency of interest), so $\omega_{LO2}$ is 600 MHz. The system's sampling rate $\omega_S=2\omega_{LO2}$ is now 1.2 Giga-samples/sec (GS/s), thus only 1.2×max($\omega_{RF}$) and only 60% of the Nyquist rate required to sample max($\omega_{RF}$) directly.

FIG. 1 schematically shows a system 100 for carrying out the measurement. The system includes a two-way splitter 102 for splitting a signal of unknown frequency ωRF into two signals, $\omega_{F1}$, $\omega_{F2}$ of equal power, a first circuit 104-1 configured to generate an electrical signal of a known frequency $\omega_{LO1}$ that is at least half the known signal bandwidth, a second circuit 104-2 configured to generate an electrical signal of known frequency $\omega_{LO2}$ that is higher than $\omega_{LO1}$, a first mixer 106-1 adapted to mix one of the two split signals with unknown frequency $\omega_{RF}$ with $\omega_{LO1}$, a second mixer 106-2 adapted to mix the other of the two split signals with unknown frequency $\omega_{RF}$ with $\omega_{LO2}$, a first low pass filter 108-1 coupled to the output of the first mixer, and a second low pass filter 108-2 coupled to the output of the second mixer. The mixers may be MEMS chips, PLL-based digital chips, or other suitable components. The low pass filters filter the sum frequencies, $\omega_{LO}+\omega_{RF}$ while passing the difference frequencies $\omega_{LO}-\omega_{RF}$. The digital sampling system 110 need not be digital and may be any suitable frequency determination component (e.g., a phase lock loop).

Figure 2:
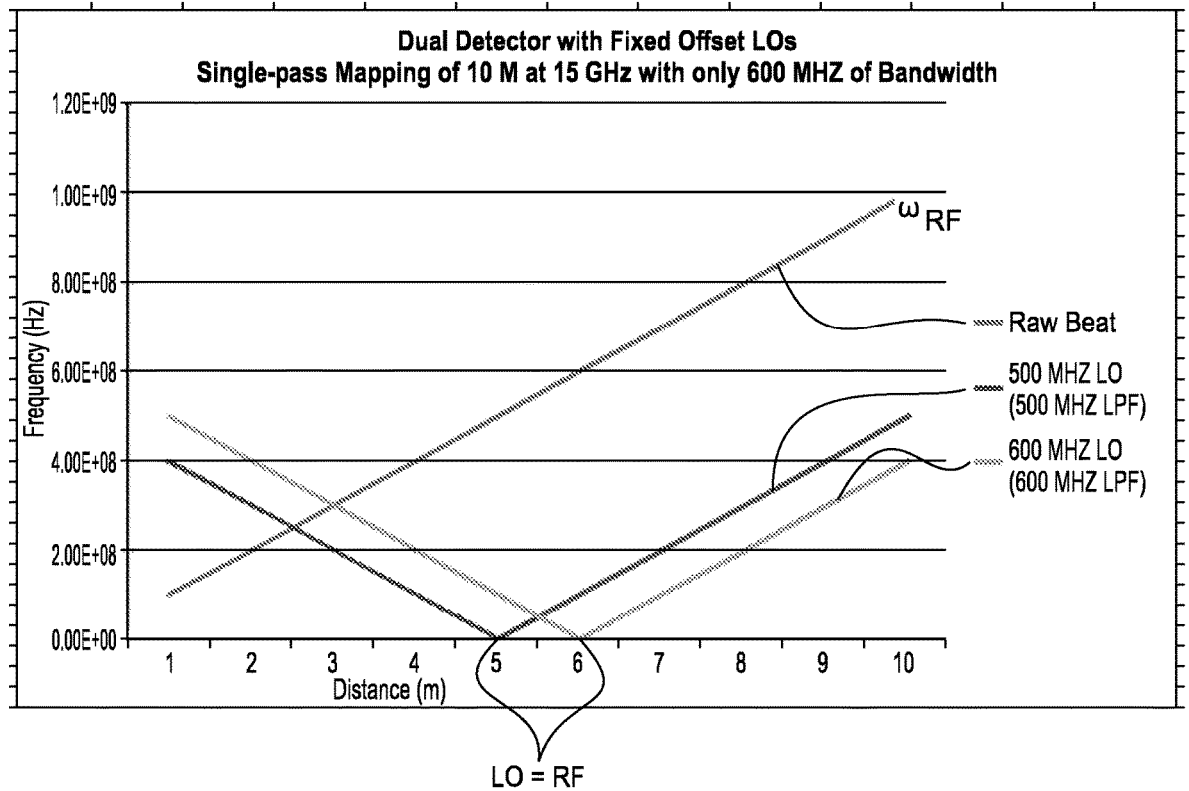
FIG. 2 is a graphical illustration of a method embodiment of the invention.

Per the model graph shown in FIG. 2, any frequency ωRF in a range of 0 Hz to 1.0 GHz can be unambiguously determined with a sample rate ωS=1.2 GS/s as follows:

$$\omega_{\beta LO}=\text{LPF}([\max(\omega_{RF},\omega_{LO})]-\min(\omega_{RF},\omega_{LO})],\omega_{LO})$$

$$\omega_{\beta LO2}=\text{LPF}([\max(\omega_{RF},\omega_{LO2})]-\min(\omega_{RF},\omega_{LO2})],\omega_{LO2}).$$

Determination of the frequency $\omega_{RF}$ is now accomplished by evaluating the frequencies $\omega_{\beta LO}$ and $\omega_{\beta LO2}$ at any given time and comparing their relative magnitudes. Circuitry used to determine $\omega_{\beta LO}$ and $\omega_{\beta LO2}$, and hence determining $\omega_{RF}$ may include analog to digital conversion circuits, a phase locked loop together with an analog to digital conversion circuit, or any other means familiar to one skilled in the art.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. No language in the specification should be construed as indicating any non-claimed element as essential to the practice of the invention.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We claim:

1. A range finding method, comprising:
   illuminating a surface of a distant object with a known frequency modulated laser beam over a known bandwidth, the laser beam comprising laser light;

mixing a portion of the laser light reflected from the surface of the distant object with a portion of the original illumination laser light on a photodetector to generate a mixed light;

generating a range-encoded beat signal having an unknown frequency $\omega_{RF}$ within a known maximum range-dependent frequency bandwidth from the mixed light; and unambiguously determining the frequency of the range-encoded beat signal by:

splitting the range-encoded beat signal having an unknown frequency $\omega_{RF}$ into two halves of equal power;

mixing one of the two split signals with a first signal having a known, fixed frequency $\omega_{LO1}$; and mixing the other of the two split signals with a second signal having a known, fixed frequency $\omega_{LO2}$;

wherein the first known frequency $\omega_{LO1}$ is at least one-half of the known maximum range-dependent frequency bandwidth and the second known frequency $\omega_{LO2}$ is higher than $\omega_{LO1}$.

2. The method of claim 1, further comprising generating each of the first signal having a known, fixed frequency $\omega_{LO1}$ and the second signal having a known, fixed frequency $\omega_{LO2}$ using a corresponding at least one of a crystal oscillator, a Microelectromechanical System (MEMS) oscillator, a digital phase locked loop, and a frequency synthesizer.

3. The method of claim 1, wherein the step of mixing one of the two split signals with a first signal having a known, fixed frequency $\omega_{LO1}$ generates a sum of $\omega_{RF}$ and $\omega_{LO1}$ and a difference of $\omega_{RF}$ and $\omega_{LO1}$;

wherein the step of mixing the other of the two split signals with a second signal having a known, fixed frequency $\omega_{LO2}$ generates a sum of $\omega_{RF}$ and $\omega_{LO2}$ and a difference of $\omega_{RF}$ and $\omega_{LO2}$;

the method further comprising using a first low pass filter to block transmission of the sum of $\omega_{RF}$ and $\omega_{LO1}$, and using a second low pass filter to block the transmission of the sum of $\omega_{RF}$ and $\omega_{LO2}$.

4. The method of claim 3, further comprising determining the frequency of each of the difference of $\omega_{RF}$ and $\omega_{LO1}$ and the difference of $\omega_{RF}$ and $\omega_{LO2}$ using a corresponding at least one of an analog-to-digital converter and a phase-locked loop.

5. The method of claim 1, wherein the step of mixing one of the two split signals with a first signal having a known, fixed frequency $\omega_{LO1}$ generates a difference of $\omega_{RF}$ and $\omega_{LO1}$, and wherein the step of mixing the other of the two split signals with a second signal having a known, fixed frequency $\omega_{LO2}$ generates a difference of $\omega_{RF}$ and $\omega_{LO2}$, and the method further comprising comparing the difference of $\omega_{RF}$ and $\omega_{LO1}$ and the difference of $\omega_{RF}$ and $\omega_{LO1}$ to determine the frequency of the range-encoded beat signal, whereby a distance to the distant object is determined.

6. The method of claim 3, further comprising comparing the difference of $\omega_{RF}$ and $\omega_{LO1}$ and the difference of $\omega_{RF}$ and $\omega_{LO2}$ to determine the frequency of the range-encoded beat signal, whereby a distance to the distant object is determined.

* * * * *